United States Patent [19]

Akao et al.

[11] Patent Number: 4,868,602
[45] Date of Patent: Sep. 19, 1989

[54] IMAGING DEVICE

[75] Inventors: Michitoshi Akao, Nagoya; Kenji Sakakibara; Tokunori Katoh, both of Ichinomiya, all of Japan; Yukichi Sawaki, Gifu, all of Japan

[73] Assignee: Brother Kogyo Kabushiki Kaisha, Japan

[21] Appl. No.: 223,568

[22] Filed: Jul. 25, 1988

[30] Foreign Application Priority Data

Jul. 24, 1987 [JP] Japan .................. 62-186137

[51] Int. Cl.⁴ ........................................ G03B 27/32
[52] U.S. Cl. ........................................ 355/27; 355/28
[58] Field of Search .................. 355/27–29, 355/107

[56] References Cited

U.S. PATENT DOCUMENTS 4,816,873  3/1989  Hatta ........................................ 355/27

Primary Examiner—L. T. Hix
Assistant Examiner—D. Rutledge
Attorney, Agent, or Firm—Kane, Dalsimer, Sullivan, Kurucz, Levy, Eisele & Richard

[57] ABSTRACT

An imaging device employing a continuous recording sheet which carries thereon a plurality of photo and pressure sensitive microcapsules. Each microcapsule contains therein a dye precursor and a photo-curable resin. By exposing the recording sheet to an optical image, a corresponding latent image is formed thereon with hardened and unhardened microcapsules. The unhardened microcapsules are ruptured by a pressure-developing means and dye precursors streamed out of the ruptured microcapsules react to developer coated on a separate cut-sheet type developer sheet. In order to prevent the pressure-developing means from being polluted by components of microcapsules of the recording sheet, all over the portion of the recording sheet, on which an optical image is not exposed, is fully exposed to a light to harden substantially whole microcapsules carried thereon.

5 Claims, 3 Drawing Sheets

IMAGING DEVICE

BACKGROUND OF THE INVENTION

This invention relates to an imaging device, more particularly, to an imaging device employing a recording medium which carries thereon a plurality of photo and pressure sensitive microcapsules, each microcapsule containing therein a dye precursor and a photo-curable resin.

The imaging device of this type generally comprises exposure means for exposing the recording medium to an optical image information so as to form a latent image thereon corresponding to an image to be recorded, a pressure-developing means for pressing the recording medium carrying the latent image to develop a visible image thereon, and transporting means for transporting the recording medium from the exposure means to the pressure development means.

With the above imaging device, the latent image is formed on the recording medium by exposing the optical image thereon to selectively cure the photo-curable resins enveloped in the microcapsules existing on the area corresponding to the exposed optical image. The latent image thus formed on the recording medium is then transferred and developed on a separate developing medium on which a developer is coated. Transferring of the image is executed by superposing the recording medium and the developing medium one on the other and pressurizing the superposed mediums so that the unhardened microcapsules on the recording medium are ruptured by the applied pressure and the dye precursors enveloped therein are streamed out of the ruptured microcapsules. The streamed-out dye precursors are reacted to the developer coated on the developing medium so as to form the visible image thereon corresponding to the above latent image.

In order to make the arrangements in the device and maintenances therefor simple and easy, the continuous type of the above recording medium, one end of which is rolled on a feed roll while the other end on a take-up roll, has been employed. With this continuous type recording medium, it is fed from the feed roll to the take-up roll through the exposure and the pressure-developing means. When it passes the exposure means, the latent image is formed thereon, and when it passes the pressure-developing means, the latent image is transferred and developed on the cut-sheet type developing mediums which are successively supplied to be superposed on the corresponding areas of the continuous recording medium before it reaches the pressure-developing means.

With the imaging device employing the above continuous type recording medium, however, there exists one problem. That is, there is a possibility that the pressure-developing means is polluted by the components streamed out of the microcapsules when the recording medium is pressurized without the developing medium superposed thereon. This occurs, for instance, each time the imaging operation is started after the prior imaging operation is once terminated. That is, since the last exposed portion of the continuous recording medium must have at least been transported to the pressure-developing means from the exposure means before terminating the operation, there remains on-exposed portion of the continuous recording medium between the exposure means and the pressure-developing means. This non-exposed portion must pass the pressure-developing means when the beginning portion of the continuous recording medium on which the latent image is formed in the next imaging operation is transported to the pressure-developing means.

In order to dissolve the above problem, the pressure applied by pressure-developing means, for instance, by a pair of pressing rollers, must be released to freely pass the non-exposed portion of the continuous recording medium. It is, however, cost-consumptive and complicates the arrangements to design, for instance, one of the pressing rollers movable away from the other during the passing of the non-expose portion of the continuous recording medium while properly pressurising the exposed part of the continuous recording medium at substantially constant pressure value.

SUMMARY OF THE INVENTION

It is therefore an object of this invention to provide an improved imaging device of the above described type capable of preventing the pressure-developing means from being polluted by the streamed out components of the microcapsules coated on nonexposed portion of the recording medium.

For the above purpose, according to the invention, there is provided an imaging device employing a photo and pressure sensitive recording medium, comprising:

first exposure means for exposing said recording medium to an optical image information so as to form a latent image thereon;

a pressure-developing means for developing said latent image formed on said recording medium; and first transporting means for transporting said recording medium from said first exposure means to said pressure-developing means;

the improvement which comprises in that said imaging device further comprising:

second exposure means for exposing substantially all over the surface of said recording medium to a light;

second transporting means for transporting said recording medium to said second exposure means; and control means for controlling said second transporting means and said second exposure means so that substantially all over the surface of the predetermined portion of said recording medium is exposed to the light.

With the above constructed imaging device, the portion of the recording medium having a possibility of polluting the pressure-developing means is transported to the second exposure means by the second transporting means to entirely harden the microcapsules coated on the above portion by the second exposure means. Thus, the pressure-developing means is prevented from being polluted by components streamed out of the microcapsules coated on, for instance, the non-exposed portion of the recording medium.

DESCRIPTION OF THE ACCOMPANYING DRAWINGS

DESCRIPTION OF THE EMBODIMENTS

Figure 1:
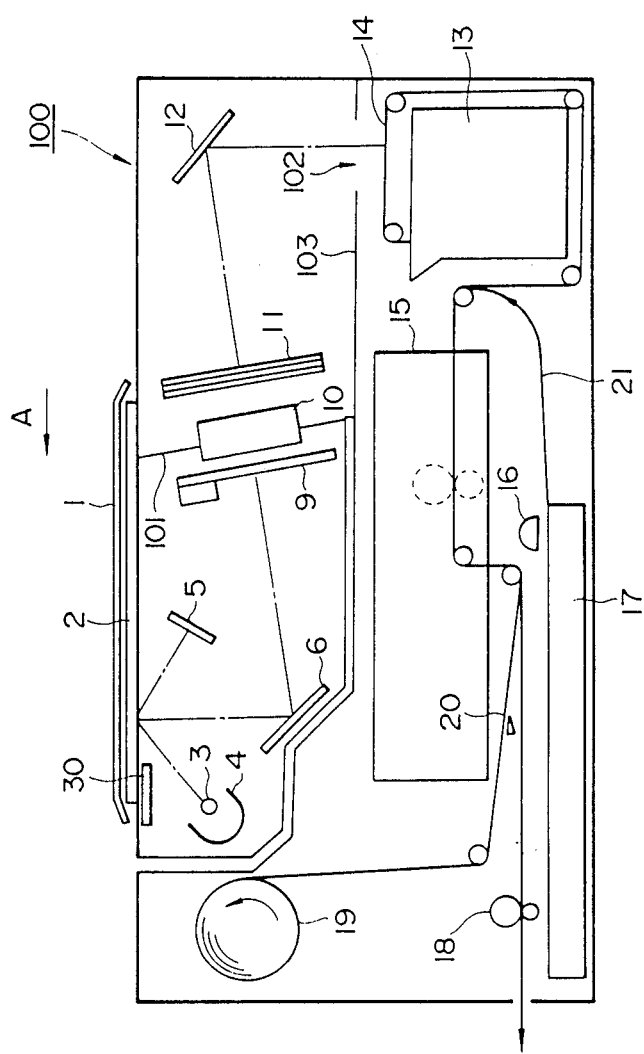
FIG. 1 is a sectional view showing a copying machine embodying the invention.

FIG. 1 shows a copying machine 100 embodying the invention, wherein an openable manuscript cover 1 is mounted on a transparent manuscript stand 2 movably arranged on the upper side of the machine 100. A manuscript, not shown, is set on the transparent manuscript stand 2 with the surface to be duplicated being turned downward.

A light source 3 which is partly surrounded by a cold mirror 4 for illuminating the surface of the manuscript is arranged below the transparent manuscript stand 2. The heat rays from the light source 3 is passed through the cold mirror 4 while the visible rays from the light source 3 is reflected by the inner surface of the cold mirror 4. In exposure operation, the manuscript stand 2 is moved along the direction of an arrow A in FIG. 1 with holding the manuscript thereon. A reflection mirror 5 is arranged for reflecting the light fed from the light source 3 but not directed to the manuscript, and the light reflected by the reflection mirror 5 is directed to the predetermined area in a moving path of the transparent manuscript stand 2.

Another reflection mirror 6 is arranged below the above predetermined area so as to lead the light reflected by the manuscript passing over the above predetermined area, into the right upper part of the machine 100 in FIG. 1, which is separated by a partition wall 101 from the left upper part of the machine 100. A lens 10 is installed in the partition wall 101 so as to converge the optical path of the light reflected by the reflection mirror 6, and a shutter 9 is arranged at the light entrance side of the lens 10 to interrupt or pass the light reflected by the reflection mirror 6.

A filter 11 provided with respective filter sections for cyan, magenta and yellow is arranged at the light output side of the lens 10. The light passed through the lens 10 and the filter 11 is downwardly reflected by a reflection mirror 12 so as to be directed to a continuous type recording sheet 14 through an aperture 102 formed on a partition wall 103 which separates the machine 100 into the upper part and the lower part.

The recording sheet 14 carries thereon a plurality of photo and pressure sensitive microcapsules. Each microcapsule contains therein a dye precursor and a photo-curable resin.

The recording sheet 14 is reserved in a patorone 13 in a rolled state on a feed roll, not shown, and is wound up by a take-up roll 19 arranged at the left portion of the machine 100 in FIG. 1. The recording sheet 14 is taken up by the take-up roll 19 and therefore fed from the patorone 14 at a speed synchronous with that of the movement of the manuscript stand 2, and is successively exposed to the light reflected by the reflection mirror 12 when passes below the aperture 102.

The recording sheet 14 thus exposed is then led to a pressure-developing unit 15 by a plurality of guide rollers. The pressure-developing unit 15 is constructed, for instance, as disclosed in the U.S. Ser. No. 107,296 filed on Oct. 9, 1987 in the name of the present assignee. Just before the recording sheet 14 is led to the pressure-developing unit 15, a cut-sheet type developer sheet 21 is fed from a sheet feeding cartridge 17, arranged below the unit 15, to be superposed onto the recording sheet 14. The developer sheet 21 is fed, piece by piece, by a feed roll 16 with a predetermined time-lag from the exposure, i.e., the illumination with the light source 3 to the manuscript to be duplicated. Thus, the latent image formed on the recording sheet 14 is transferred and developed on the developer sheet 21 at the pressure-developing unit 15.

The developer sheet 21 having passed the pressure-developing unit 15 is then separated from the recording sheet 14 by a pawl plate 20 and discharged out of the machine 100 after passing a heat roll pair 18. By applying the heat onto the developed image on the developer sheet 21, the developed image is lustered.

In the meantime, below the transparent manuscript stand 2, a white board 30 is arranged movably between its retracted position and its operating position. In usual copying operation, the white board 30 is positioned at its retracted position as illustrated in FIG. 1. The white board 30 is moved to its operating position where it intercepts the lights directed to the above described predetermined area in the moving path of the manuscript stand 2 from the light source 3 and the reflection mirror 5. With the white board 30 being positioned at its operating position, therefore, all the light directed to the above predetermined area is reflected thereby and directed to the reflection mirror 6 without forming any optical image.

Figure 2:
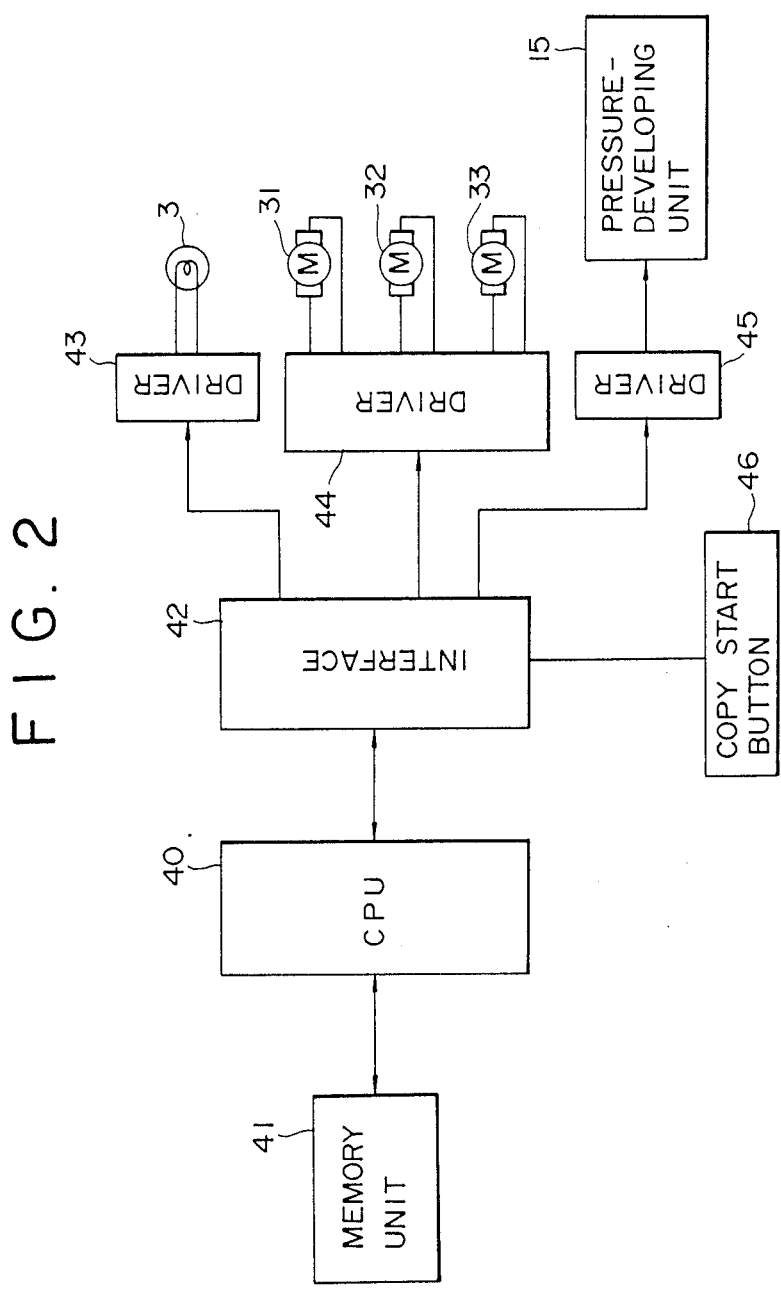
FIG. 2 is a block diagram showing operation control means employed in the copying machine of FIG. 1.

FIG. 2 shows a block diagram of a control unit employed in the above copying machine 100, which principally comprises a CPU (central processing unit) 40, a memory unit 41 and an interface unit 42.

Connected to the interface unit 42 are a driver 43 for the light source 3, a driver 44 for motors 31 through 33, a driver 45 for the pressure-developing unit 15, and a copy start button 46 which is arranged on the outer surface of the copying machine 100. The motor 31 drives the take-up roll 19 for winding up the recording sheet 14. The motor 32 drives a feed roll contained in the patorone 13 to reversely take up the recording sheet 14 which has already been fed therefrom. The motor 33 drives a driving mechanism, not shown, for reciprocally moving the white board 30 between its retracted and operating positions.

The control unit controls the operation of the machine 100 by means of the CPU 40 executing programs stored in the memory unit 41.

In usual copying operation, the manuscript to be duplicated is first set between the cover 1 and the transparent manuscript stand 2. Then upon pressing the copy start button 46, the CPU 40 turns on the light source 3 through the driver 43 and drives the motor 31 through the driver 44 to initiate the movement of the manuscript stand 2 leftwardly in FIG. 1 as well as to wind up the recording sheet 14 by the take-up roll 19 in synchronous with the movement of the manuscript stand 2.

During movement of the manuscript stand 2, the optical image which is formed with the light reflected by the surface of the manuscript is continuously exposed through the aperture 102 onto the recording sheet 14 fed from the patorone 13 so as to form a corresponding latent image thereon. Thereafter, the recording sheet carrying the latent image thereon is led to the pressure-developing unit 15. The travel distance of the recording sheet 14 between the patorone 13 and the pressure-developing unit 15 has been set to be longer than the length of the manuscript to be duplicated.

With the predetermined time lag from the start of the movement of the manuscript stand 2, the developer sheet 21 is fed by the feeding roll 16 from the cartridge 17 to be superposed onto the image carrying portion of the recording sheet 14. Then the superposed sheets 14, 21 are led into the pressure-developing unit 15, where the visible image is developed on the developer sheet 21. The developer sheet 21 carrying the developed image is separated from the recording sheet 14 and discharged out of the machine 100 via the heat roll pair 18.

Figure 3:
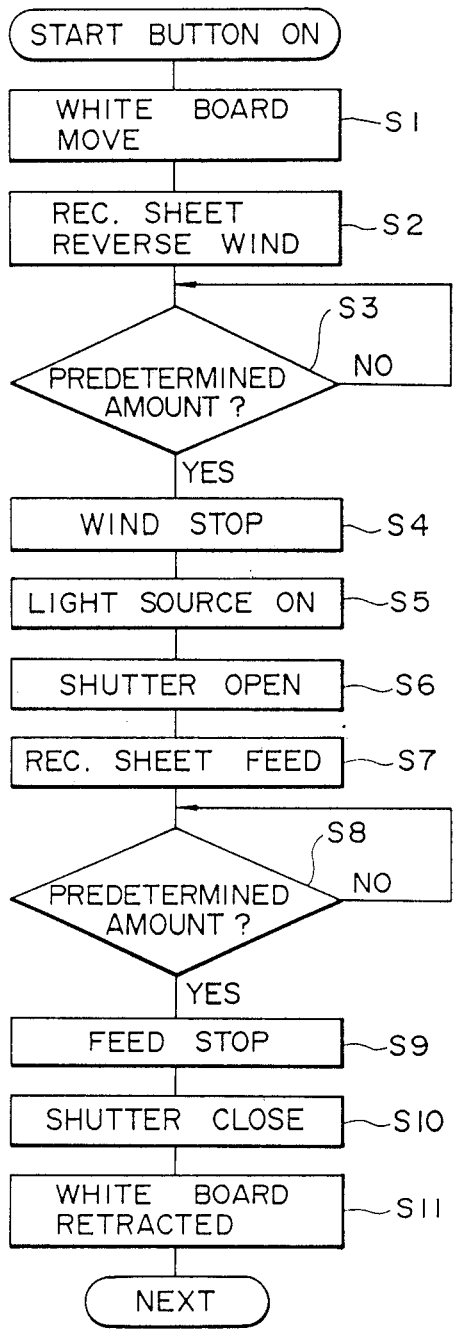
FIG. 3 is a control flow chart of one of control programs executed by the operation control means of FIG. 2.

In this copying machine 100, a characteristic program is executed by the CPU 40 at the time when the copy start button 46 is turned on. FIG. 3 shows a flow chart thereof.

In FIG. 3, upon the copy start button 46 being turned on, the steps S1 through S11 are successively executed by the CPU 40. That is, first, the white board 30 is moved to its operating position (Step S1), and the recording sheet 14 is reversely taken up into the patorone 13 for a predetermined amount (Steps S2 through S4). The amount to be reversely taken up is set to be substantially the same amount as the travel distance of the recording sheet 14 between the output of the patorone 13 and the entrance of the pressure-developing unit 15.

After the steps S2 through S4 are completed, the light source 3 is turned on and the shutter 9 is opened (Steps S5 and S6). Then, the recording sheet 14 is fed from the patorone 13 for the amount corresponding to the reversely-taken-up amount (Steps S7 through S9).

Thereafter, the shutter 9 is closed and the white board 30 is moved to its retracted position (Step S10 and S11). Then the program advances to the usual copying processings.

With these processings, the microcapsules coated on the recording sheet 14 existing between the output of patorone 13 and the entrance of the pressure-developing unit 15 are entirely hardened. Therefore, it is prevented that parts arranged inside the pressure-developing unit 15 are polluted by the components streamed out of the microcapsules.

Although in the above embodiment, the recording sheet 14 is exposed to the light reflected by the white board 30 when it is again fed from the patorone 13 after once taken up into the patorone 13, the light reflected by the white board 30 may of course be exposed to the recording sheet 14 while it is reversely taken up into the patorone 13.

Further, separate light source may be employed for exposing entire surface of the above predetermined portion of the recording sheet 14, and it is enough if the majority part of the microcapsules is hardened.

In the meantime, the above processings illustrated in FIG. 3 may of course be arranged such that they are processed also when a re-set button, not shown, is operated after jammings or other troubles are settled.

What is claimed is:

1. An imaging device employing a photo and pressure sensitive recording medium, comprising:

first exposure means for exposing said recording medium to an optical image information so as to form a latent image thereon;

a pressure-developing means for developing said latent image formed on said recording medium; and first transporting means for transporting said recording medium from said first exposure means to said pressure-developing means;

the improvement which comprises in that said imaging device further comprising:

second exposure means for exposing substantially all over the surface of a predetermined portion of said recording medium to a light;

second transporting means for transporting said recording medium to said second exposure means; and control means for controlling said second transporting means and said second exposure means so that substantially all over the surface of the predetermined portion of said recording medium is exposed to the light.

2. The imaging device according to claim 1 wherein a single light source is used for either said first exposure or said second exposure means, and wherein said first exposure means forms an optical image to be exposed onto said recording medium by illuminating a light emitted from said light source against an original subject to be duplicated while said second exposure means includes a retractable reflecting member for intercepting a light emitted from said light source against said original subject to direct said light onto said recording medium as it is.

3. The imaging device according to claim 1 which further comprises a feed roll and a take-up roll, between which said said recording medium is bridged, and wherein said first transporting means rotates said take-up roll to wind said recording medium while said second transporting means rotates said feed roll to reversely wind said recording medium.

4. The imaging device according to claim 3 wherein said control means controls said first transporting means, said second transporting means and said second exposure means, in such a fashion that said second transporting means reversely winds up said recording medium for a predetermined amount and then said first transporting means winds up said recording medium for said predetermined amount, and wherein said second exposure means exposes said predetermined amount of said recording medium when said recording medium is wound up by said first transporting means.

5. The imaging device according to claim 4 wherein said predetermined amount substantially corresponds to a distance of transporting said recording medium from where said recording medium is exposed by said first exposure means to said pressure-developing means.

* * * * *